(12) United States Patent
Lu et al.

(10) Patent No.: US 7,058,120 B1
(45) Date of Patent: Jun. 6, 2006

(54) INTEGRATED HIGH-SPEED SERIAL-TO-PARALLEL AND PARALLEL-TO-SERIAL TRANSCEIVER

(75) Inventors: Jinghui Lu, Austin, TX (US); Shahriar Rokhsaz, Austin, TX (US); Stephen D. Anderson, Minnetonka, MN (US); Michael A. Nix, Buda, TX (US); Ahmed Younis, Austin, TX (US); Michael Ren Kent, Austin, TX (US); Yvette P. Lee, Austin, TX (US); Firas N. Abughazaleh, Austin, TX (US); Brian T. Brunn, Austin, TX (US); Moises E. Robinson, Austin, TX (US); Kazi S. Hossain, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 831 days.

(21) Appl. No.: 10/051,222

(22) Filed: Jan. 18, 2002

(51) Int. Cl.
*H03K 11/00* (2006.01)
*H04L 25/60* (2006.01)
*H04L 25/64* (2006.01)

(52) U.S. Cl. .................. 375/214; 375/373; 341/100; 341/101; 370/366; 710/71

(58) Field of Classification Search ............... 375/214, 375/377; 341/100, 101; 370/366; 710/71
See application file for complete search history.

(56) References Cited

U.S. PATENT DOCUMENTS

| 5,614,855 | A |   | 3/1997 | Lee et al. |
|-----------|---|---|--------|-----------|
| 5,721,545 | A |   | 2/1998 | Poplevine |
| 5,805,089 | A |   | 9/1998 | Fiedler et al. |
| 6,147,672 | A | * | 11/2000 | Shimamoto ............... 345/589 |
| 6,148,047 | A | * | 11/2000 | Mohindra ................. 375/346 |
| 6,466,071 | B1 | * | 10/2002 | Kim et al. ................. 327/175 |
| 6,741,846 | B1 | * | 5/2004 | Welland et al. ............ 455/260 |
| 2001/0018334 | A1 | * | 8/2001 | Ipek et al. ................ 455/318 |
| 2001/0033407 | A1 |   | 10/2001 | Cao |

FOREIGN PATENT DOCUMENTS

WO    WO 98/27678    6/1998

* cited by examiner

*Primary Examiner*—Kevin Burd
*Assistant Examiner*—Juan Alberto Torres
(74) *Attorney, Agent, or Firm*—Timothy W. Markison; Thomas A. Ward; Justin Liu

(57) ABSTRACT

A transceiver includes a receiver section and a transmitter section. The receiver section includes a clocking circuit, a serial-to-parallel module, and compensation. The transmitter section includes a clocking circuit, parallel-to-serial module, and compensation. The compensation within the receiver section and transmitter section compensates for integrated circuit (IC) processing limits and/or integrated circuit (IC) fabrication limits within the clocking circuits, serial-to-parallel module, and parallel-to-serial module that would otherwise limit the speed at which the transceiver could transport data.

22 Claims, 11 Drawing Sheets transceiver 10

S to P module 18 with compensation 20 converter 44 or 46

Rx clocking circuit 16 with compensation 20 duty cycle distortion
correction module 88

P to S module 30 with compensation 32 converter 134 or 136

Tx clocking circuit 28 with compensation 32

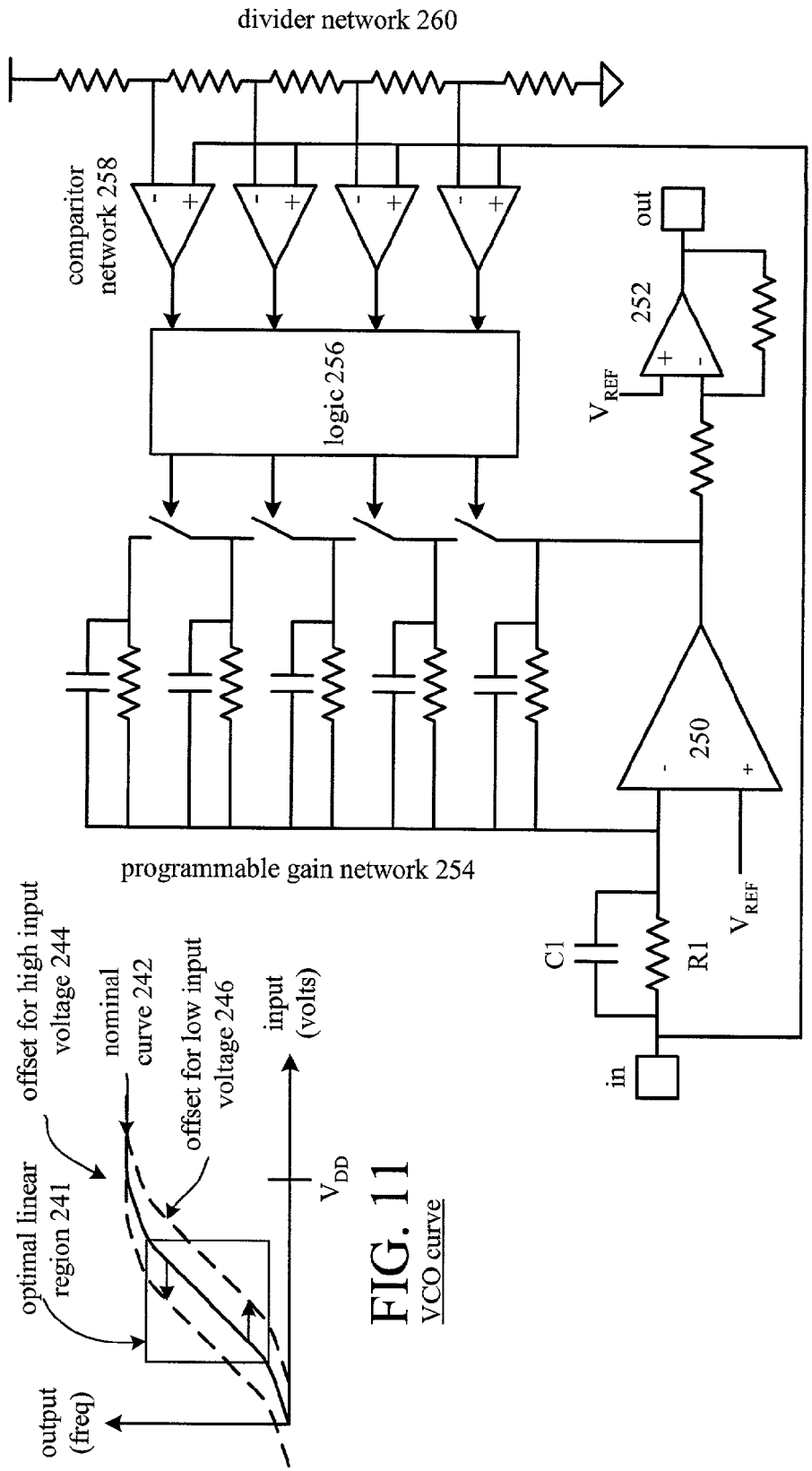

transceiver 275

INTEGRATED HIGH-SPEED SERIAL-TO-PARALLEL AND PARALLEL-TO-SERIAL TRANSCEIVER

TECHNICAL FIELD OF THE INVENTION

This invention relates generally to communication systems and more particularly to high-speed transceivers used therein.

BACKGROUND OF THE INVENTION

Communication systems are known to transport large amounts of data between a plurality of end user devices, which, for example, include telephones, facsimile machines, computers, television sets, cellular telephones, personal digital assistants, et cetera. As is also known, such communication systems may be local area networks (LAN) and/or wide area networks (WAN) that are stand-alone communication systems or interconnected to other local area networks and/or wide area networks as part of the public switched telephone network, public switched data network, integrated service digital network, the Internet, et cetera. As is further known, communication systems include a plurality of system equipment to facilitate the transporting of data. Such system equipment includes, but is not limited to, routers, switches, bridges, gateways, protocol converters, frame relays, private branch exchanges, et cetera.

The transportation of data within communication systems is governed by one or more standards that ensure the integrity of data conveyances and fairness of access for data conveyances. For example, there are a variety of Ethernet standards that govern serial transmissions within a communication system at data rates of 10 megabits per second, 100 megabits per second, 1 gigabit-per-second and beyond. In accordance with such standards, many system components and end user devices of a communication system transport data via serial transmission paths. Internally, however, the system components and end user devices process data in a parallel manner. As such, each system component and end user device includes at least one high-speed transceiver, which includes a high-speed serial-to-parallel receiver and a high-speed parallel-to-serial transmitter.

As the demand for data throughput increases, so do the demands on the high-speed transceiver. The increased throughput demands are pushing some current integrated circuit manufacturing processes to their operating limits, where integrated circuit processing limits (e.g., device parasitics, trace sizes, propagation delays, device sizes, et cetera) and IC fabrication limits (e.g., IC layout, frequency response of the packaging, frequency response of bonding wires, et cetera) limit the speed at which a high-speed transceiver may operate, jitter performance, and/or noise performance. Such limitations are forcing transceiver designers to seek alternative implementations. For instance, some designers are electing to use multiple serial paths coupled in parallel to transmit data at higher rates. For example, to obtain a 10 gigabit-per-second path, four 3.125 gigabit-per-second transceivers are bonded together to function as a 10 gigabit-per-second transceiver. The bonding requires that each 3.125 gigabit-per-second path operate in a known and controlled relationship with respect to the other paths such that transceived data can be accurately transmitted and subsequently reconstructed. As such, additional circuitry is needed to achieve the bonding and additional buses are needed to transport the bonded data. As is known, each bus requires a separate driver to mitigate transmission line effects of the bus, thus, each additional bus requires an additional driver, which increases power consumption.

Another alternate high-speed transceiver implementation is to use multilevel encoding over a single bus. As is known, multilevel encoding uses various voltage levels to indicate the value of data currently being transmitted. For example, four different voltage levels may be used to represent two bits of data. For accuracy of transmission, the difference between each voltage level should be significant enough to readily distinguish them at the receiving end. This becomes more difficult as the supply voltages of the integrated circuit decrease with improvements in integrated circuit fabrication processes. For instance, 0.10 micron CMOS technology allows integrated circuits to be powered from a supply voltage of approximately 1 volt.

A further alternative for transceivers is to use an integrated circuit technology that inherently provides for greater speeds. For instance, switching from a CMOS process to a silicon germanium or gallium arsenide process would allow integrated circuit transceivers to operate at greater speeds, but at substantially increased manufacturing costs. Currently, for most commercial-grade applications, including communication systems, such alternate integrated circuit fabrication processes are too cost prohibitive for wide spread use.

Therefore, a need exists for a high-speed transceiver that operates at rates, which push the operating limits of the IC fabrication process, meets desired jitter performance requirements and noise requirements, does so without requiring bonding of multiple transceivers to achieve the desired rate, and does so for a given IC fabrication process.

BRIEF DESCRIPTION OF THE DRAWINGS

FIG. 11 illustrates a graph of a voltage controlled oscillator in accordance with the present invention;

FIG. 12 illustrates a schematic block diagram of an offset module that may be used in the clocking circuit of FIG. 9.

DETAIL DESCRIPTION OF A PREFERRED EMBODIMENT

Generally, the present invention provides a transceiver that includes a receiver section and a transmitter section. The receiver section includes a clocking circuit, a serial-to-parallel module, and compensation. The transmitter section includes a clocking circuit, parallel-to-serial module, and compensation. The compensation within the receiver section and transmitter section compensates for integrated circuit (IC) processing limits and/or integrated circuit fabrication limits within the clocking circuits, serial-to-parallel module, and parallel-to-serial module that would otherwise limit the speed at which the transceiver could transport data. By compensating for IC process limits and IC fabrication limits, a transceiver fabricated using a given integrated circuit technology may operate at rates that push practical limits of operation for the given IC technology. As such, the use of bonding, multilevel encoding, and/or switching to different IC fabrication processes can be avoided and yet still achieve desired operating rates, desired jitter performance, and/or desired noise performance.

Figure 1:
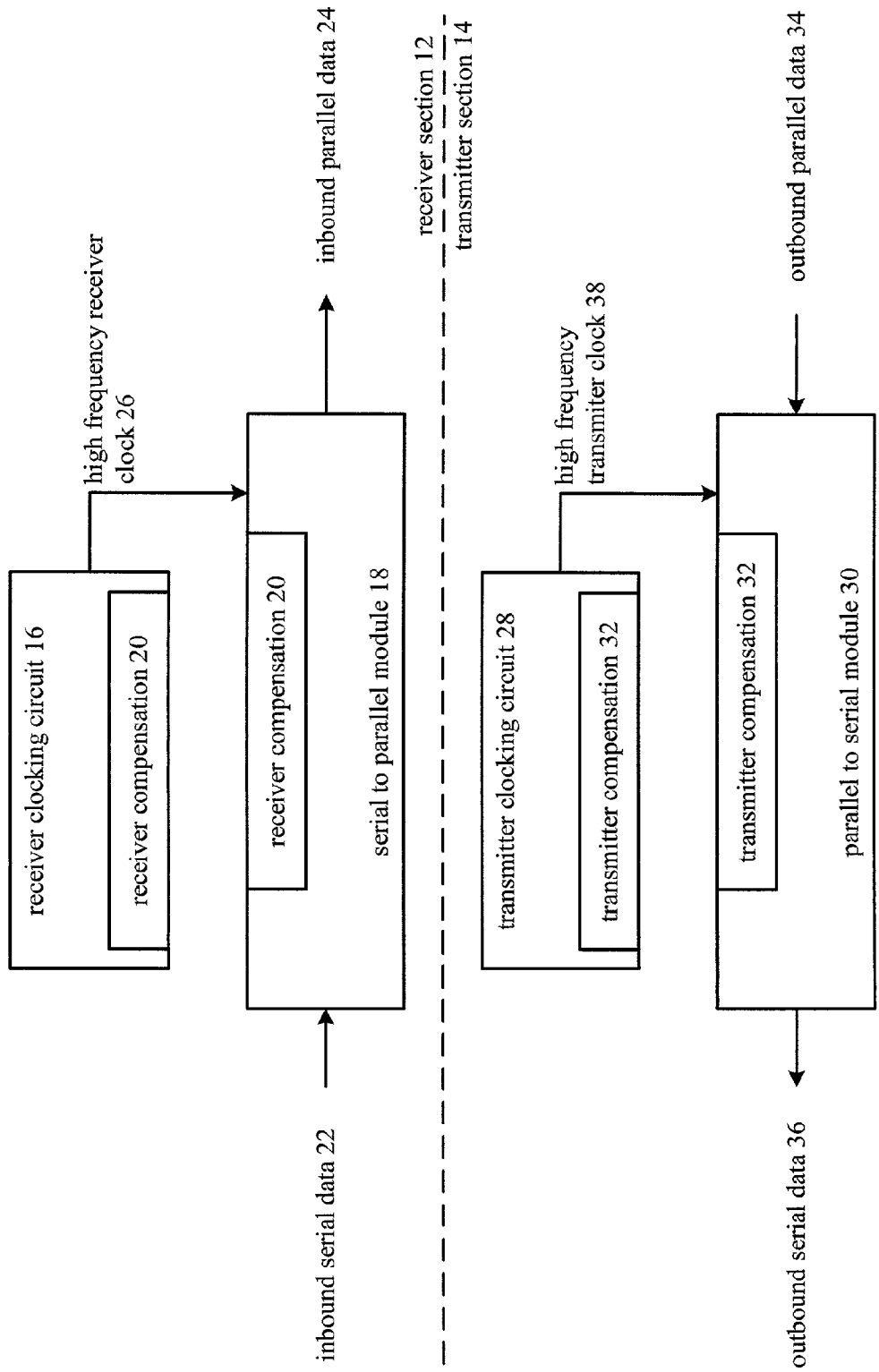
FIG. 1 illustrates a schematic block diagram of a high-speed transceiver in accordance with the present invention.

The present invention can be more fully described with reference to FIGS. 1 through 13. FIG. 1 illustrates a schematic block diagram of a transceiver 10 that includes a receiver section 12 and transmitter section 14. The receiver section 12 includes a receiver clocking circuit 16, serial-to-parallel module 18, and receiver compensation 20. The receiver compensation 20 may be part of the clocking circuit 16, may be part of the serial-to-parallel module 18, and/or a separate components and/or modules. The transmitter section 14 includes a transmitter clocking circuit 28, a parallel-to-serial module 30, and transmitter compensation 32. The transmitter compensation 32 may be part of the clocking circuit 28, may be part of the parallel-to-serial module 30, and/or may be separate components and/or modules.

Both the receiver compensation 20 and transmitter compensation 32 compensate for integrated circuit (IC) operational limits and/or IC fabrication limits. Such integrated circuit operational limits include, but are not limited to, speed of devices, size of devices, parasitics of devices, metal track sizes, et cetera. IC fabrication limits include, but are not limited to, integrated circuit layout, frequency response of packaging, frequency response of bonding wires, frequency response of IC pads, component tolerance variations, et cetera. Such IC operational limits and/or IC fabrication limits, without compensation, would, to at least some degree, adversely affect data throughput of the receiver section 12 and/or the transmitter section 14.

In operation, the receiver section 12 is operably coupled to receive inbound serial data 22 via the serial-to-parallel module 18. The serial-to-parallel module 18, which will be discussed in greater detail with reference to FIGS. 2 and 3, converts the inbound serial data 22 into inbound parallel data 24 based on a high frequency receiver clock 26. The receiver clocking circuit 16, which will be discussed in greater detail with reference to FIG. 5, generates the high frequency receiver clock 26. The receiver compensation 20 within the receiver clocking circuit 16, and/or associated with the receiver clocking circuit 16, enables the clocking circuit 16 to produce the high frequency receiver clock 26 at rates that were previously unobtained using conventional circuit designs. For example, if the transceiver 10 is implemented utilizing CMOS integrated circuit processes and conventional circuit designs, the speed of the transceiver peaks out near the 3.125 gigabits per second rate due the IC limitations. By including the compensation 20, the receiver clocking circuit 10 may produce at least a 12.5 gigabit-per-second clocking. Similarly, compensation 20 within the serial-to-parallel module 18 enables the serial-to-parallel module 18 to process the inbound serial data 22 at rates of 12.5 gigabit-per-second.

As one of average skill in the art will appreciate, transceivers fabricated using different integrated circuit technologies, such as gallium arsenide or silicon germanium, will eventually be pushed to their practical operating limits. Thus, by incorporating compensation in a similar fashion as disclosed herein, the operation of a transceiver implemented utilizing such IC technologies may push the practical limits of operation.

The parallel-to-serial module 30 is operably coupled to receive outbound parallel data 34 and, based on a high frequency transmitter clock 38, produces outbound serial data 36. The transmitter clocking circuit 28 produces the high frequency transmitter clock 38. Similar to the compensation within the receiver section, the compensation 32 within the transmitter section 14, enables the clocking circuit 28 and parallel-to-serial module 30 to operate at rates that were previously unobtained due to IC operating limits and/or IC fabrication limits using conventional circuit implementations. As such, for a CMOS integrated circuit process, the transmitter clocking circuit 28 may produce a high frequency clock 38 that operates at 6.125 gigahertz for 12.5 gigabit-per-second operation. Accordingly, the parallel-to-serial module may produce outbound serial data 36 at a 12.5 gigabit-per-second rate.

Figure 2:
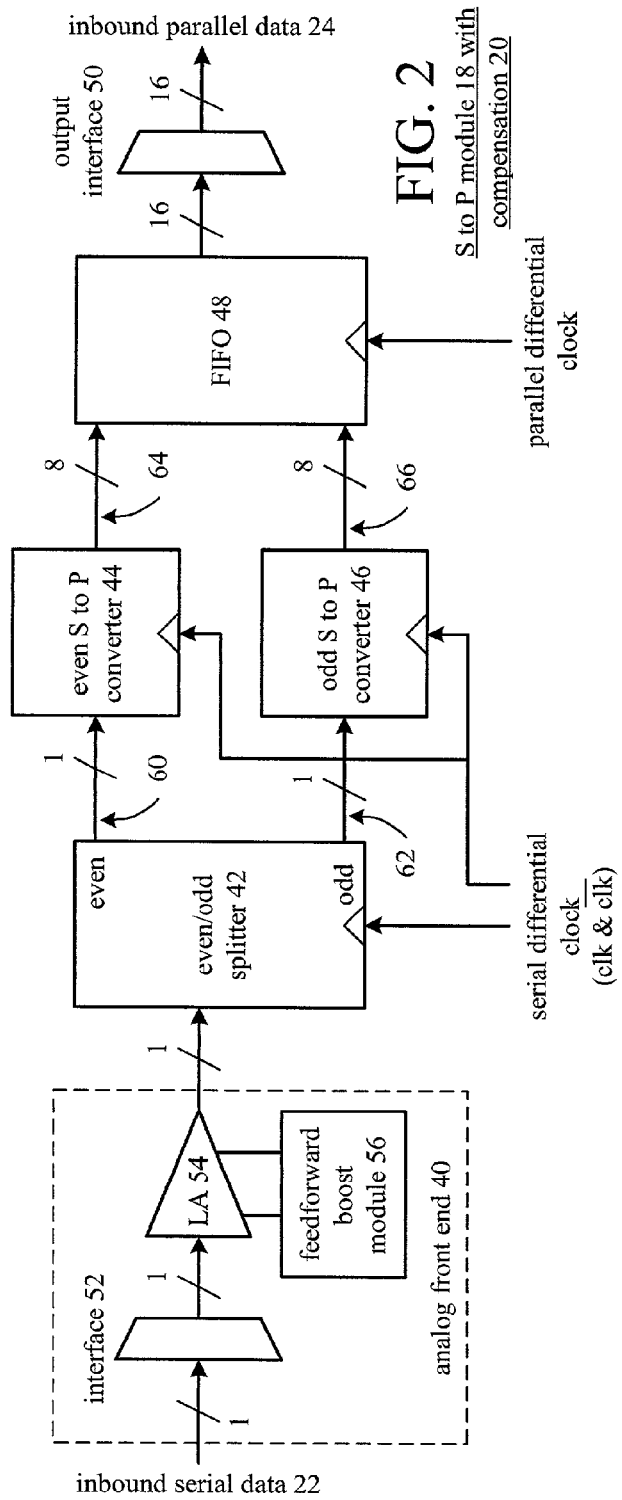
FIG. 2 illustrates a schematic block diagram of a serial-to-parallel module of the transceiver of FIG. 1.

FIG. 2 illustrates a schematic block diagram of the serial-to-parallel module 18 with compensation 20. The module 18 with compensation 20 includes an analog front-end 40, an even/odd splitter 42, an even serial-to-parallel converter 44, an odd serial-to-parallel converter 46, an optional first-in-first-out memory 48, and an outbound interface 50. The analog front-end 40 includes an interface 52, an inductance amplifier 54 and a feed-forward boost module 56. The inductance amplifier 54 in combination with the feed-forward boost module 56 provides compensation for at least some of the integrated circuit operating limits and/or integrated circuit fabrication limits. For a detailed discussion of the inductance amplifier 54 and feed-forward boost module 56 refer to co-pending patent application entitled INDUCTIVE AMPLIFIER WITH A FEED-FORWARD BOOST, inventor Shahriar Rokhsaz, filed this date.

Figure 3:
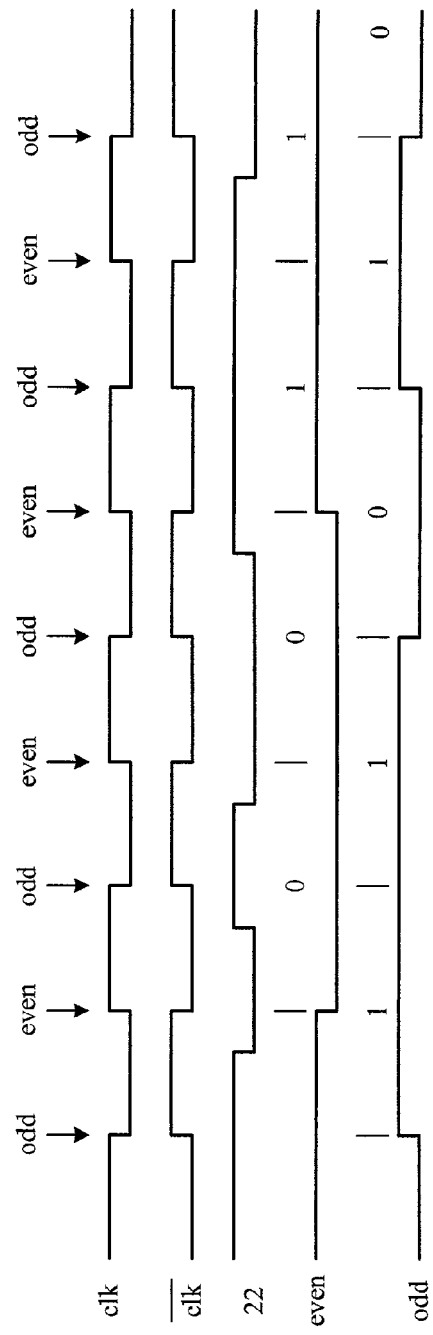
FIG. 3 illustrates a timing diagram for the serial-to-parallel module of FIG. 2.

In operation, the analog front-end 40 receives the inbound serial data 22, amplifies, and equalizes it prior to providing it to the even/odd splitter 42. The even/odd splitter 42, based on a serial differential clock, which will be described in greater detail with reference to FIG. 5, produces a serial even data stream 60 and a serial odd data stream 62. The even and odd data streams correspond to the sampling of the inbound serial data 22 received from the analog front-end. Referring to FIG. 3, the clock and clock bar illustrate the even and odd sampling. The inbound serial data 22 is sampled at the even and odd intervals of the clock and clock bar. As such, for each even sample, the even/odd splitter 42 produces a serial data stream 60 at ½ the rate of clock and clock bar. Similarly, the even/odd splitter 42 produce an odd serial data stream 62 based on the odd sampling intervals, where the odd serial data stream is ½ the rate of clock and clock bar. In one embodiment, the fine phase detector 74 (of FIG. 5) functions as the even/odd splitter 42.

Returning back to FIG. 2, the even serial-to-parallel converter 44 receives the even serial data and converts it into parallel data. For instance, the even serial-to-parallel converter 44 may convert the serial data into 8-bit parallel data. The functionality of the even serial-to-parallel converter 44 will be discussed in greater detail with reference to FIG. 4.

The odd serial-to-parallel converter 46, at the serial clock rate, converts the serial odd data into parallel odd data. For instance, the odd serial-to-parallel converter 46 may convert the serial data into 8-bit parallel data. The details of the odd serial-to-parallel converter 46 will also be described with reference to FIG. 4.

The FIFO 48 receives the parallel even data and parallel odd data and stores it at a parallel differential clock rate. The outbound interface 50 retrieves the even and odd parallel data to produce the inbound parallel data 24 and transmit to a requesting circuit component of the device containing the transceiver 10.

Figure 4:
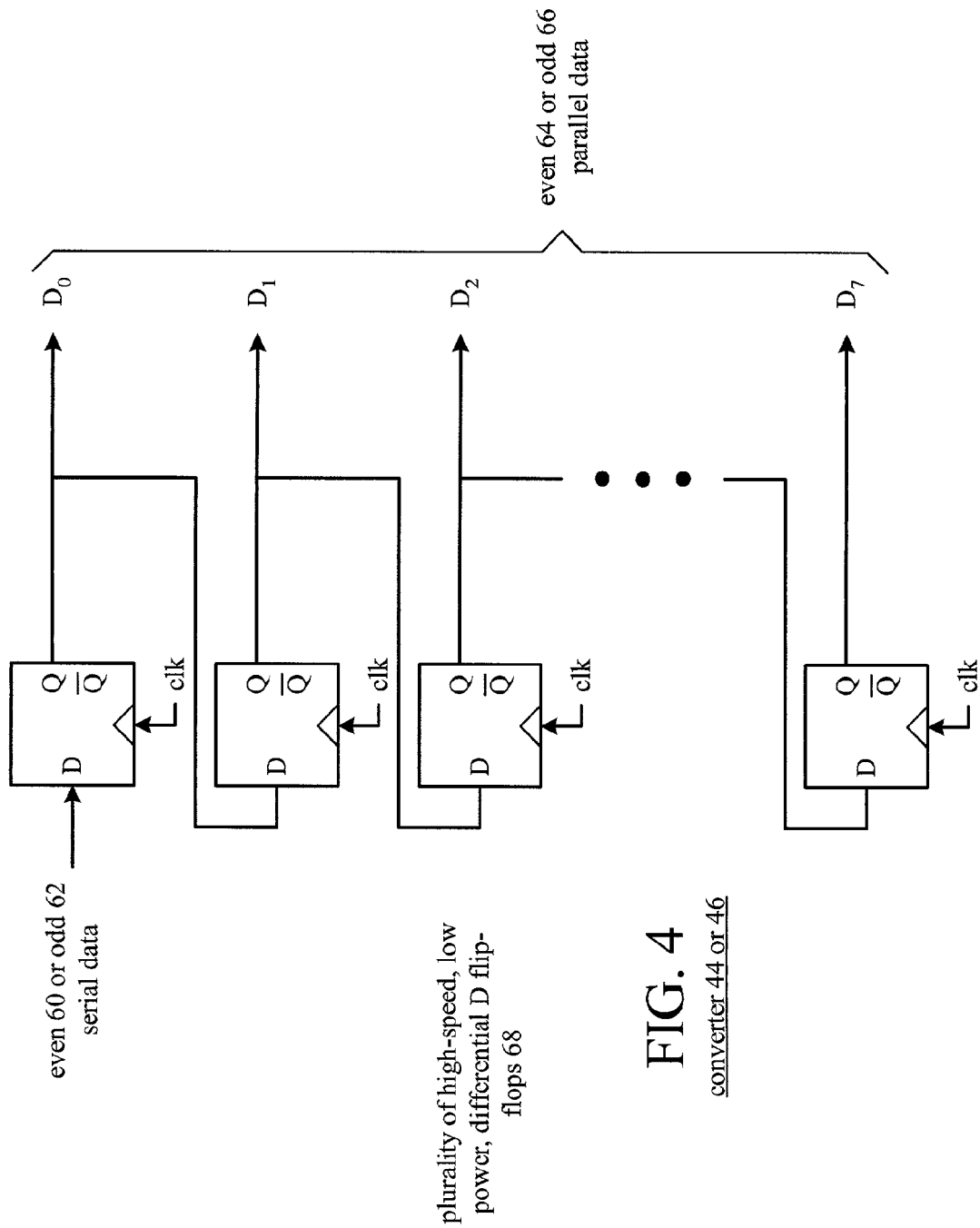
FIG. 4 illustrates a schematic block diagram of a serial-to-parallel converter of the serial-to-parallel module of FIG. 2.

FIG. 4 illustrates a schematic block diagram of the even and odd serial-to-parallel converters 44 and 46. Each converter includes a plurality of high-speed, low-power, differential D flip-flops 68. To provide the compensation, the differential D flip-flops may be implemented as disclosed in co-pending patent application entitled HIGH-SPEED DIFFERENTIAL FLIP-FLOP, inventor Michael A. Nix, having a Ser. No. 09/994,233 and a filing date of Nov. 26, 2001.

The D flip-flops 68 have a master/slave configuration such that the $1^{st}$ D flip-flop receives the even data 60 or the odd serial data 62. On the $1^{st}$ clocking interval (i.e., inputs data on a rise edge, outputs data on a falling edge of the clock), the $1^{st}$ D flip-flop produces the output bit $D_7$. On the next even/odd clock cycle, the top D flip-flop outputs $D_6$ while the $2^{nd}$ from the top D flip-flop outputs $D_7$. Accordingly, the 8-bits (i.e., $D_7$ through $D_0$) propagate through the plurality of D flip-flops until the even parallel data 64 or odd parallel data 66 is obtained as illustrated. Once this data is obtained, it is read into the FIFO and the next 8 bits are converted from a serial format to parallel format.

As one of average skill in the art will appreciate, the D flip-flops may use a differential signaling format for both input and output signals or a single-ended signal format.

Figure 5:
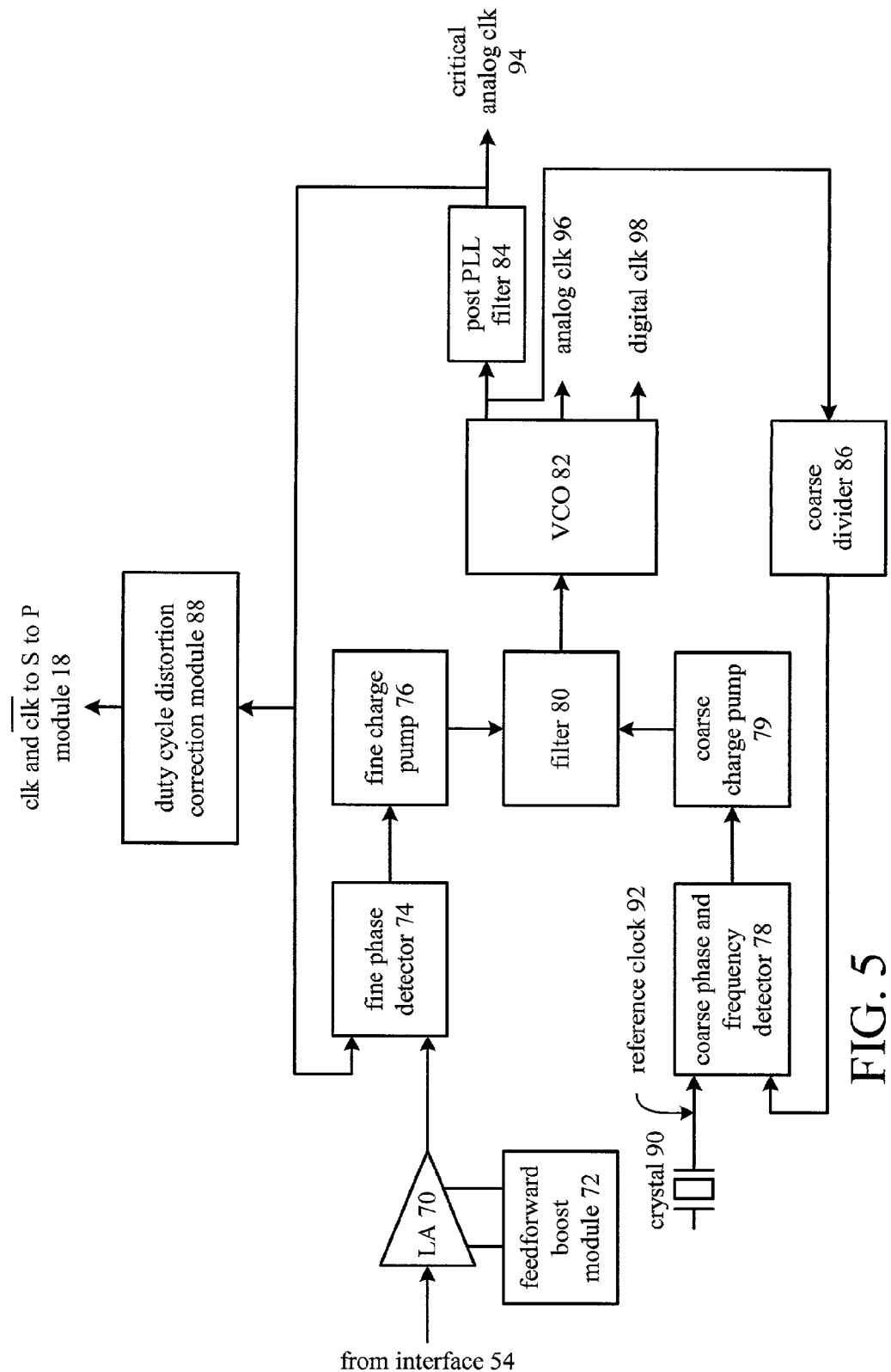
FIG. 5 illustrates a schematic block diagram of a clocking circuit used in the receiving section of the transceiver of FIG. 1.

FIG. 5 illustrates a schematic block diagram of the receiver clock circuit 16 with compensation 20. The clock circuit 16 with compensation 20 includes two phase locked loops (PLL): a coarse PLL and a fine PLL. In general, the coarse PLL establishes the desired frequency for the clocking circuit and the fine PLL adjusts the phase of the clock once the frequency is established to align it with the incoming data, which has a corresponding frequency to the one generated by the coarse PLL. The coarse PLL includes crystal 90, coarse phase and frequency detector 78, coarse charge pump 79, filter 80, voltage controlled oscillator 82, post phase locked loop filter 84, coarse divider 86, and duty cycle distortion correction module 88. The fine PLL includes a fine phase detector 74, a fine charge pump 76, the filter 80, the voltage controlled oscillator 82, the post phase locked loop filter 84, and the duty cycle distortion correction module 88. The clocking circuit may also include an inductance amplifier 70 and feed-forward boost module 72 to provide the incoming serial data to the fine phase detector 74.

To establish the operating frequency for the clocking circuit, crystal 90, or some other clock source, produces a reference clock 92 that is provided to the coarse phase and frequency detector 78. The coarse phase and frequency detector 78 determines the phase and frequency difference between the reference clock 92 and a divided representation of analog clock 94. The coarse divider 86 provides the divided representation of the analog clock 94 to the coarse phase and frequency detector 78. Based on the phase and frequency relationship of these signals, the coarse phase and frequency detector 78 produces a coarse difference signal. The coarse charge pump 79 receives the coarse difference signal and produces a voltage representation thereof and provides it to filter 80.

The filter 80 filters the voltage representation of the coarse difference signal to produce a filtered difference representation. The voltage controlled oscillator 82 receives the filtered signal and produces at least one clock signal. The voltage controlled oscillator 82 may utilize inductor-capacitor oscillators to produce the output oscillation. By utilizing inductor-capacitor oscillators in comparison to ring oscillators, the noise levels of a voltage controlled oscillator are reduced thereby compensating for IC limitations of conventional VCOs using ring oscillators.

As shown, voltage controlled oscillator 82 may produce a plurality of output clocks including the critical analog clock 94, an analog clock 96, and a digital clock 98. The production of multiple clocks by a voltage controlled oscillator in clocking circuit 16 is further described in co-pending patent application entitled CLOCK DISTRIBUTION FOR IMPROVED JITTER PERFORMANCE IN HIGH-SPEED COMMUNICATION CIRCUITS, inventors Moises E. Robinson and Ahmed Younis, having a Ser. No. 09/941,968 and a filing date of Aug. 28, 2001.

For at least the critical analog clock 94, a post phase locked loop filter 84 is included. The post phase locked loop filter 84 filters and amplifies the oscillation produced by the voltage controlled oscillator 82 to produce the critical analog clock 94. The functionality of the post phase locked loop filter 84 provides compensation and is further described in co-pending patent application having a title of A LOW JITTER TRANSMITTER ARCHITECTURE WITH POST PLL FILTER, inventor Jinghui Lu, filed on Jan. 9, 2002.

Once the coarse PLL has established the operating frequency, the fine PLL becomes active and adjusts the phase of the operating clock. In operation of the fine PLL, the inductive amplifier 70 and feed-forward boost module 72 provide compensation for the inbound serial data 22 which may be received from interface 54. The inductance amplifier 70 and feed-forward boost module 72 are further described in co-pending patent application Ser. No. 10/051,642 entitled INDUCTIVE AMPLIFIER WITH A FEED-FORWARD BOOST, having an attorney docket number and inventor Shahriar Rokhsaz. In an alternative embodiment, the fine phase detector 74 may receive the inbound serial data from inductive amplifier 54 of the analog front end 40 (of FIG. 2) and omit inductive amplifier 70 and feed-forward boost module 72.

The fine phase detector 74 receives the amplified serial input data from the inductance amplifier 70 and compares it with the critical analog clock 94. Based on a phase difference between these signals, the fine phase detector 74 produces a fine difference signal, which is provided to the fine charge pump 76. The fine charge pump 76 produces a voltage representation of the fine difference signal and provides it to the filter 80. The filter 80 filters the voltage representation of the fine difference signal to produce a filtered difference representation. The voltage controlled oscillator 82 receives the filtered signal and produces at least one clock signal.

As illustrated, the clocking circuit 16 with compensation 20 includes two phase locked loops, one is a fine phase locked loop based on the data and the other is a coarse phase locked loop based on a reference clock 92. Such sequential phased locked loop enables the receiver section to readily capture the inbound serial data. As one of average skill in the art will appreciate, the clocking circuit 16 may use single-ended signals or differential signals. As one of average skill in the art will further appreciate, the analog clock 96 and/or digital clock 98 may also include a post PLL filter 84 and/or duty cycle distortion correction module 88 to provide the corresponding filtering, amplifying, and correction benefits.

The duty cycle distortion correction module 88 receives the critical analog circuit 94 and corrects for any duty cycle distortion between the positive phase and negative phase of clock and clock bar. The duty cycle corrected clock and clock bar are provided to the serial-to-parallel module 18. Clock and clock bar, as corrected by the duty cycle distortion correction module 88, correspond to the serial differential clock referred to in FIG. 2. As one of average skill in the art will appreciate, the parallel differential clock of FIG. 2, has a rate of $\frac{1}{8}^{th}$ of the serial differential clock. Accordingly, the parallel differential clock may be readily derived from one of the serial differential clocks utilizing a divider, counter, PLL, et cetera. As one of average skill in the art will further appreciate, an alternate embodiment of the clocking circuit 16 may have the duty cycle distortion correction module 88 provide the feedback to the fine phase detector 74 as opposed to a direct connection from the post PLL filter 84.

Figure 6:
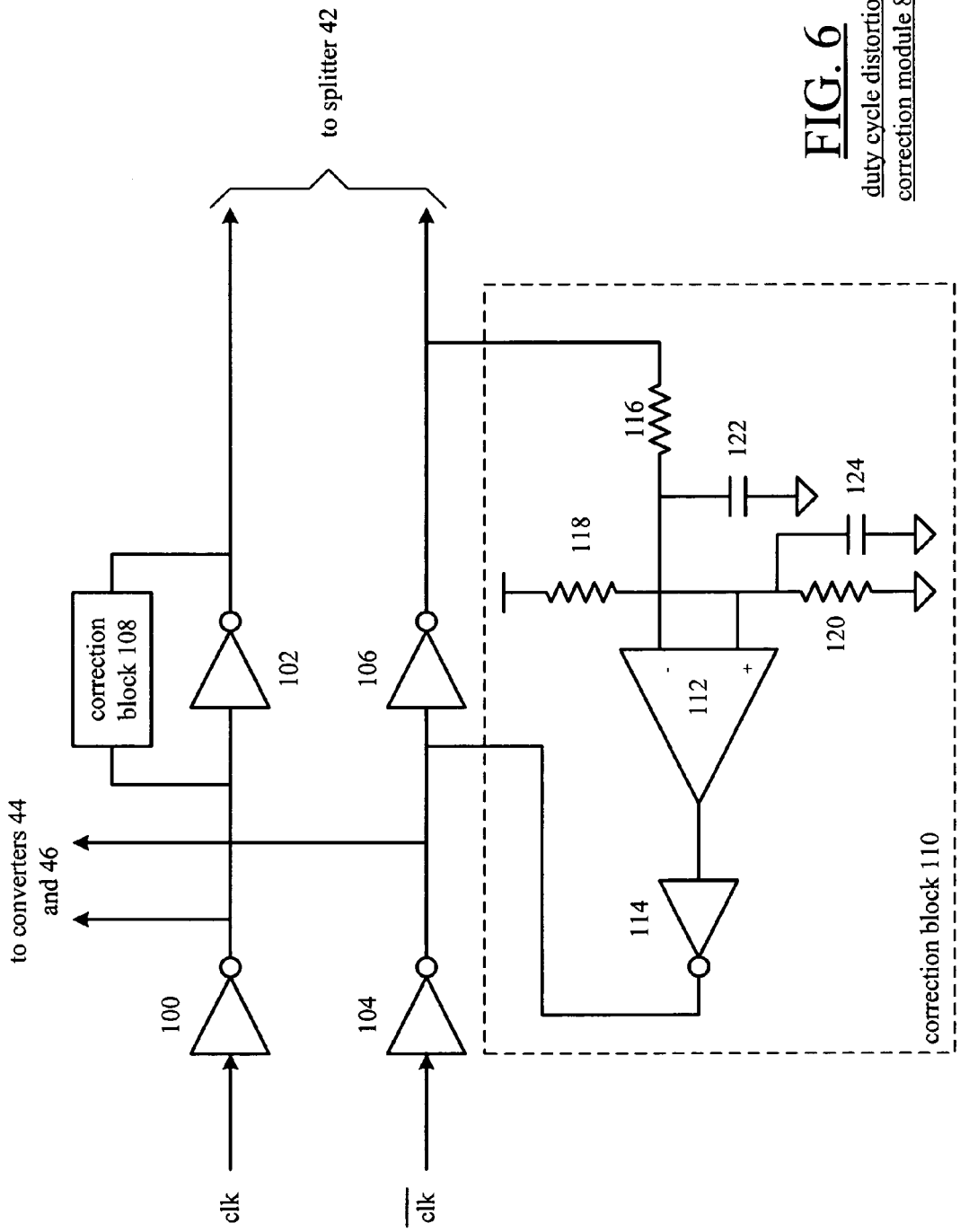
FIG. 6 illustrates a schematic block diagram of a duty cycle distortion correction module that may be used in the clocking circuit of FIG. 5.

FIG. 6 illustrates a schematic block diagram of the duty cycle distortion correction module 88. In this embodiment, the duty cycle distortion correction module 88 includes a plurality of inverters 100–106 and correction blocks 108 and 110. As shown, inverter 100 receives clock while inverter 104 receives clock bar. The outputs of inverters 100 and 104 are provided to the serial-to-parallel converters 44 and 46 of the serial-to-parallel conversion module 18. In addition, the outputs of inverters 100 and 104 are provided to inverters 102 and 106, respectively. To compensate for duty cycle variances, correction blocks 108 and 110 are coupled in parallel with inverters 102 and 106. Each correction block includes the circuitry illustrated in the correction block 110 coupled in parallel with inverter 106.

As shown, the correction block 110 includes resistors 116, 118 and 120, capacitors 122 and 124, an operational amplifier 112 and an inverter 114. In general, resistors 118 and 120 provide a reference voltage to amplifier 112, which may provide a voltage reference of ½ of the supply voltage. Resistor 116 in combination with capacitor 122 provides an average voltage representation of the output of its corresponding inverter. As such, by comparing the average output of inverter 106 with ½ the supply voltage, a difference in duty cycle between the positive phase and negative phase is obtained. For instance, if the clock is operating at exactly 50% duty cycle, the average voltage produced by resistor 116 and capacitor 122 will match the voltage produced by the resistive divider 118 and 120. As such, amplifier 112 will effectively remain off thereby providing no correction to the input of inverter 106. If, however, the duty cycle is not 50%, the amplifier 112 will produce a signal thereby causing inverter 114 to provide correction to the input of inverter 106. As shown, the outputs of inverters 102 and 106 are provided to the even and odd splitter 42 of the serial-to-parallel module 18.

Figure 7:
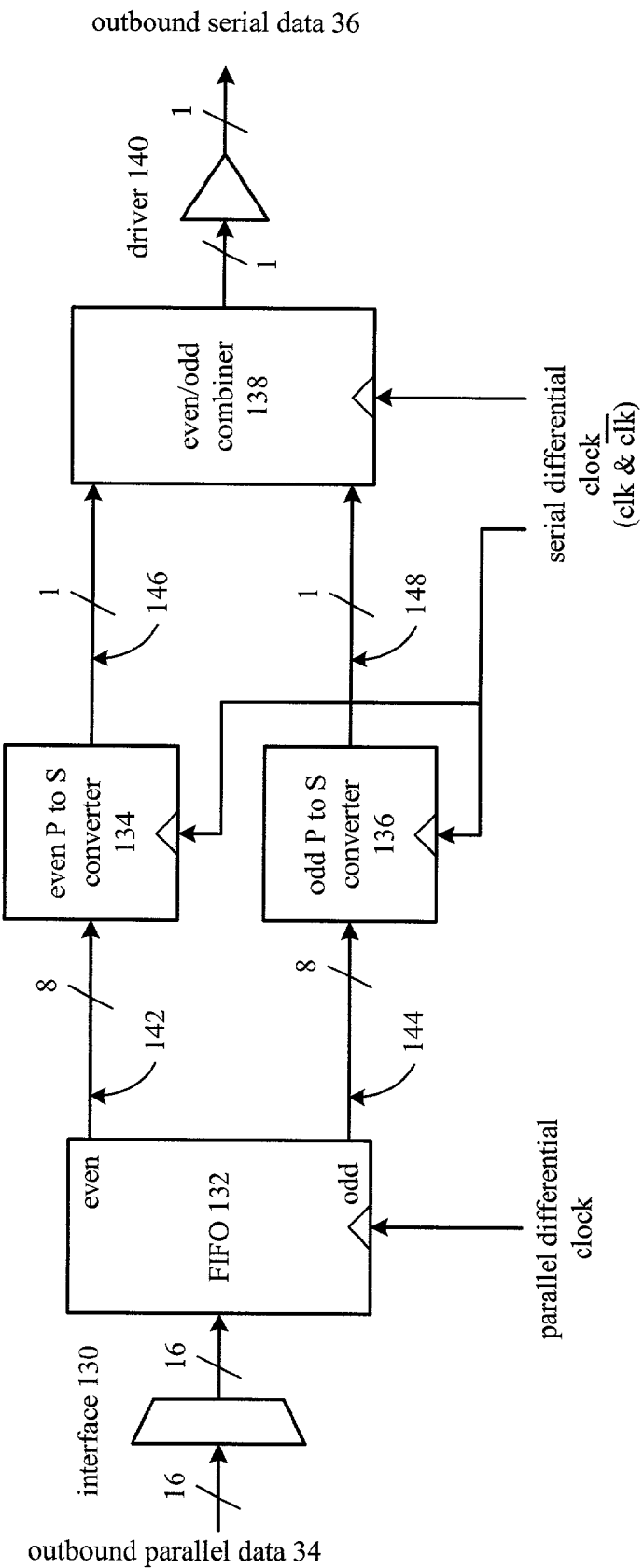
FIG. 7 illustrates a parallel-to-serial module that may be used in the transceiver of FIG. 1.

FIG. 7 illustrates a schematic block diagram of the parallel-to-serial module 30 with compensation 32. The module 30 with compensation 32 includes an interface 130, a FIFO 132, an even parallel-to-serial converter 134, an odd parallel-to-serial converter 136, an even/odd combiner 138 and a driver 140. The interface 130 may include a differential input interface having a calibrated input impedance and a buffer operably coupled to temporarily store the outbound parallel data 34. For a more detailed discussion of interface 130, refer to co-pending patent application entitled DIFFERENTIAL TERMINATION WITH CALIBRATION FOR DIFFERENTIAL SIGNALING, inventor Michael Kent and Michael A. Nix, having a Ser. No. 10/013,438 and a filing date of Dec. 10, 2001.

In this illustration, the interface 130 receives a 16-bit representation of the parallel data 34 and provides it to FIFO 132, which stores it based on a parallel differential clock. The transmitter clock circuit 28, which will be described with reference to FIG. 9, produces the parallel differential clock. The data is read from the FIFO 132 as even parallel data 142 and odd parallel data 144.

The even parallel-to-serial converter 134, which will be described in greater detail with reference to FIG. 8, receives the even parallel data 142 and produces even serial data 146 at a rate corresponding to a serial differential clock. The transmitter clocking circuit 28 produces the serial differential clock. Similarly, the odd parallel-to-serial converter 136 converts the parallel odd data 144 into serial odd data 148.

The even/odd combiner 138 receives the even serial data and odd serial data and produces combined serial data. The functionality and construct of the even/odd combiner 138 may be further described in co-pending patent application entitled A TRANSMITTER WITH MULTI-PHASE DATA COMBINER FOR PARALLEL-TO-SERIAL DATA CONVERSION, inventors Jinghui Lu and Michael A. Nix, filed on Jan. 9, 2002.

The driver 140 receives the combined serial data and produces the outbound serial data 36. The driver 140 may be implemented as described in co-pending patent application entitled Q-EMPHASIZED AMPLIFIER WITH INDUCTOR BASED BANDWIDTH BOOSTER, inventor of Jinghui Lu, filed on Jan. 9, 2002. As one of average skill in the art will appreciate, the signals within the parallel-to-serial module 30 with compensation 32 may be single-ended signals or differential signals.

Figure 8:
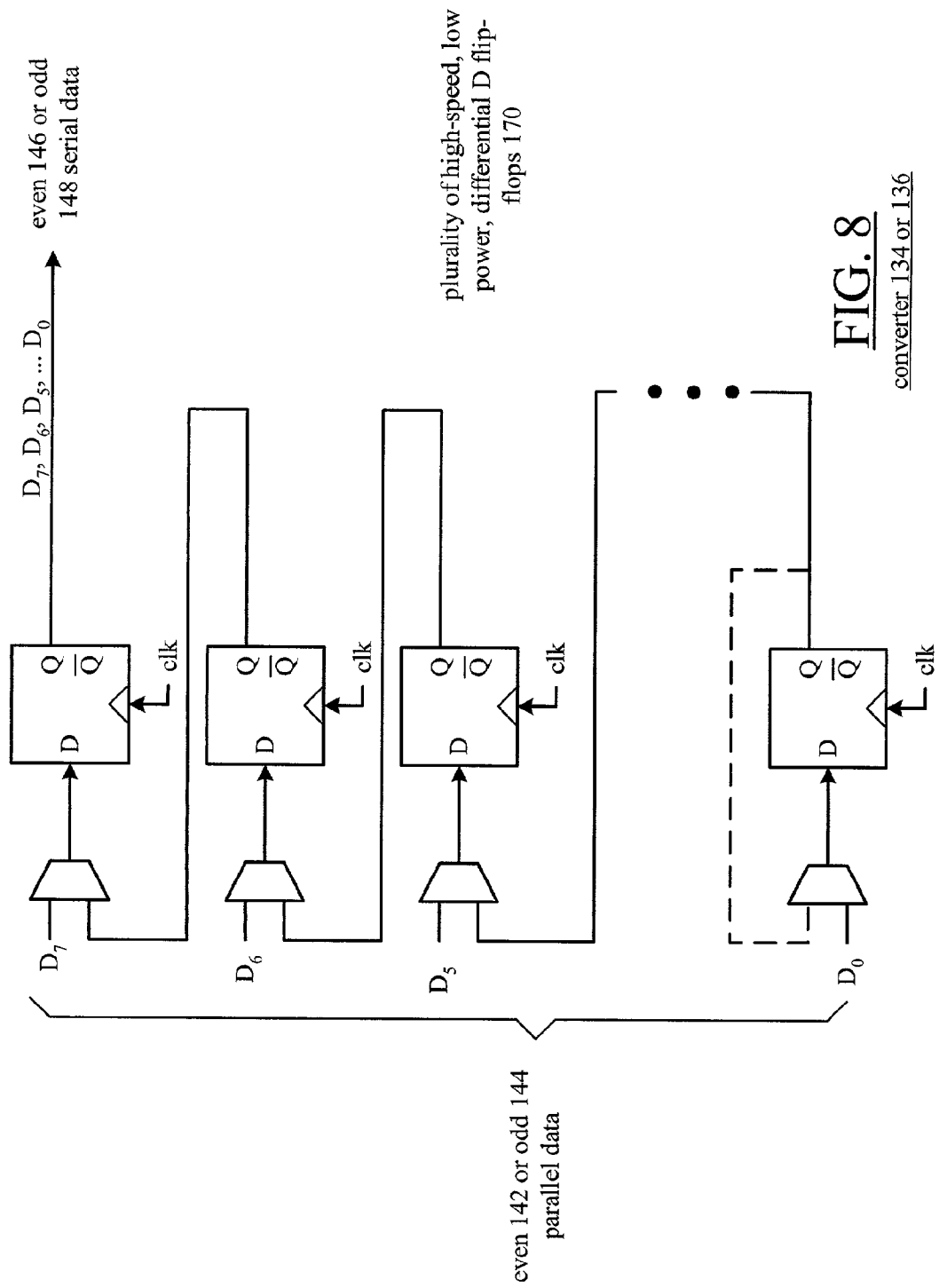
FIG. 8 illustrates a schematic block diagram of a parallel-to-serial converter that may be used in the parallel-to-serial module of FIG. 7.

FIG. 8 illustrates a schematic block diagram of the even parallel-to-serial converter 134 and odd parallel-to-serial converter 136. As shown, the converters 134 or 136 include a plurality of high-speed, low-power differential D flip-flops 170. Such D flip-flops are further described in co-pending patent application entitled, HIGH-SPEED DIFFERENTIAL FLIP-FLOP, inventor Michael A. Nix, having a Ser. No. 09/994,233 and a filing date of Nov. 26, 2001.

The plurality of flip-flops is operably coupled to receive even parallel data 142 or odd parallel data 144 which, for this illustration, is 8 bits (e.g., $D_7$–$D_0$) The parallel data is propagated through the plurality of flip-flops in a serial manner to produce the even serial data 146 or odd serial data 148. Note that the order illustrated is most significant bit first. For least significant bit ordering, the input pattern may be reversed or the coupling of the plurality of flip-flops may be reversed.

As one of average skill in the art will appreciate, the parallel input and serial output may be single-ended signals or differential signals. In addition, one of average skill in the art will appreciate the even and odd parallel data 142 or 144 may be latched into the inputs of the corresponding D flip-flops via multiplexers, or some other type of isolation circuit, to provide isolation from the preceding circuit. One of average skill in the art will further appreciate, the bottom D flip-flop that is shown to receive $D_0$ as its input, may further include a loop back from its Q output to its D input to provide a known input throughout the propagation of data through the plurality of flip-flops.

Figure 9:
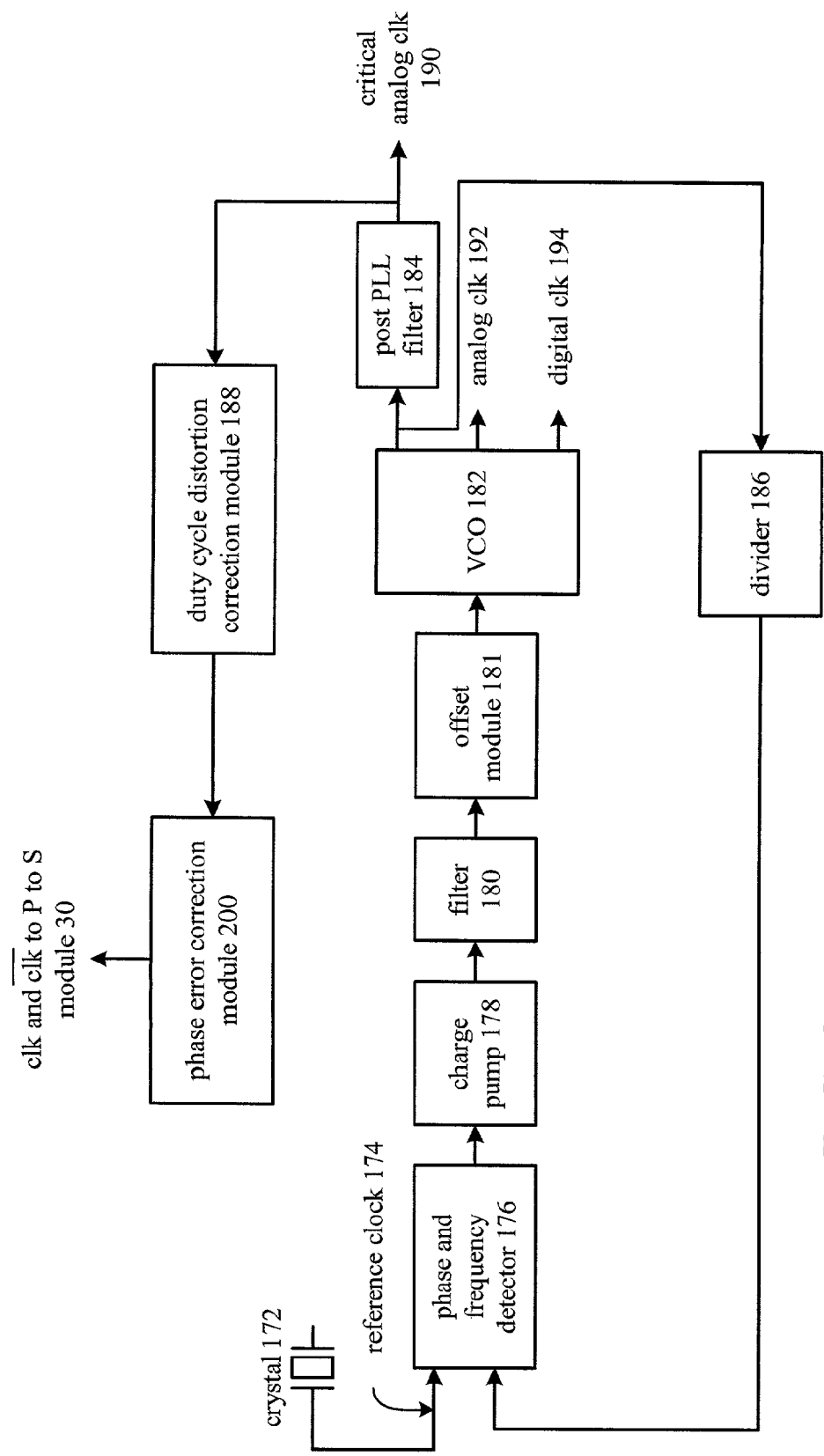
FIG. 9 illustrates a schematic block diagram of a clocking circuit that may be used in the transmitter section of the transceiver of FIG. 1.

FIG. 9 illustrates a schematic block diagram of the transmitter clocking circuit 28 with compensation 32. The circuit 28 with compensation 32 includes a crystal 172 or other clock source, phase and frequency detector 176, charge pump 178, filter 180, offset module 181, voltage controlled oscillator 182, post PLL filter 184, divider 186, duty cycle distortion correction module 188, and phase error correction module 200.

The phase and frequency detector 176 is operably coupled to determine a difference between phase and frequency of the reference clock 174 and a divided representation of the output clock 190. The divider 186 divides an output the VCO 182 to produce the divided representation of the output clock 190. The charge pump 178 produces a voltage representation of the difference, which is subsequently filtered by filter 180. The filtered signal is then provided to the offset module 181, which may provide a DC offset correction to the filtered signal prior to providing it as an input to the voltage controlled oscillator 182. The detail of offset module 181 will be described in greater detail with reference to FIGS. 11 and 12.

The voltage controlled oscillator 182 may produce one or more output oscillations, where at least one is coupled to a post PLL filter 184. As one of average skill in the art will appreciate, a post PLL filter 184 may process each of the output clocks 190, 192 and 194. The voltage controlled oscillator 182 may utilize inductor/capacitor oscillators as opposed to ring oscillators to provide compensation for IC fabrication and/or operation limitation of ring oscillators. In addition, the production of multiple clocks via the voltage controlled oscillator 182 may be done as described in co-pending patent application entitled CLOCK DISTRIBUTION FOR IMPROVED JITTER PERFORMANCE IN HIGH-SPEED COMMUNICATION CIRCUITS, inventors Moises E. Robinson and Ahmed Younis, having a Ser. No. 09/941,968 and a filing date of Aug. 28, 2001.

The post PLL filter 184 filters the clock circuit to produce a critical analog clock 190. The functionality and operation of the post PLL filter 184 is further described in co-pending patent application entitled A LOW JITTER TRANSMITTER ARCHITECTURE WITH POST PLL FILTER, inventor Jinghui Lu, filed Jan. 9, 2002.

The duty cycle distortion correction module 188 receives the analog clock 190 and produces corrected duty cycle clocks therefrom. The phase error correction module 200 receives the output of duty cycle distortion correction module 188 and corrects any phase error between clock and clock bar before providing them to the parallel-to-serial module 30. As one of average skill in the art will appreciate, the parallel differential clock utilized by the parallel-to-serial module 30 may be readily derived from the serial differential clock produced by the phase error correction module 200. As one of average skill in the art will further appreciate, the signals within the clocking circuit 28 with compensation 32 may be single-ended signals or differential signals.

Figure 10:
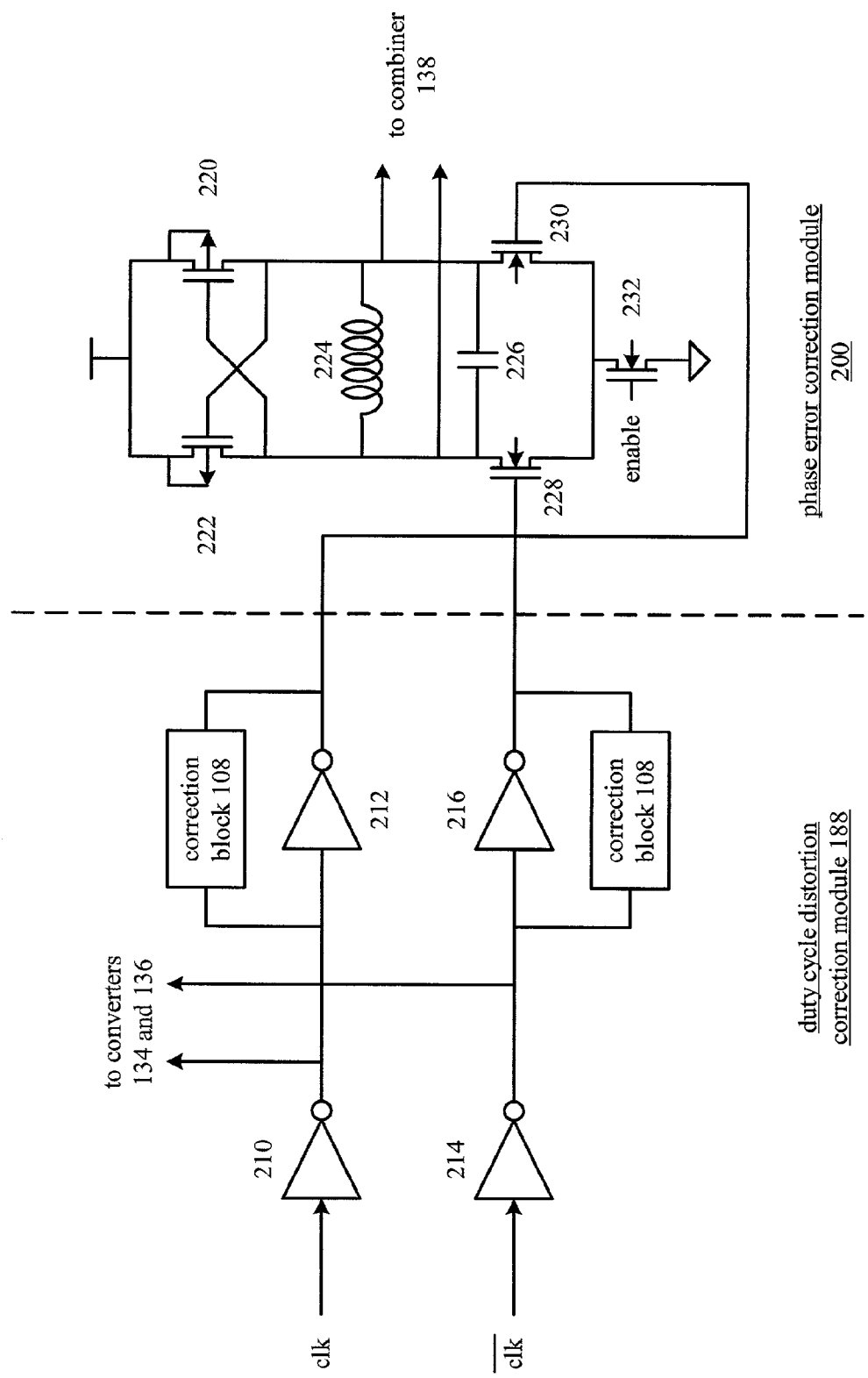
FIG. 10 illustrates a schematic block diagram of a duty cycle distortion correction module and phase error correction module that may be used in the clocking circuit of FIG. 9.

FIG. 10 illustrates a schematic block diagram of the duty cycle distortion correction module 188 and the phase error correction module 200. The duty cycle distortion correction module 188 includes inverters 210–216 and correction blocks 108. As shown, the clock and clock bar signals are inverted via inverters 210 and 214 and provided to serial-to-parallel converters 134 and 136. Clock and clock bar are also provided to inverters 212 and 216, which have corresponding correction blocks 108 coupled in parallel. As such, the output of the duty cycle distortion correction module 188 has duty cycle corrected clock and clock bar signals. However, even though the duty cycles may be corrected to be 50%, the phase relationship between clock and clock bar may be skewed due to a differing level of duty cycle correction between the two signals.

The phase error correction module 200 corrects for any phase differences between clock and clock bar. The phase error correction module 200 includes transistors 220, 222, 228, 230 and 232 and a tank circuit, which includes inductor 224 and capacitor 226. As configured, the phase error correction module 200 will correct for phase differences between the inputs received at the gates of transistor 228 and 230 in accordance to the resonant frequency of the tank circuit. The resulting phase and duty cycle corrected clock signals are provided to the combiner 138 of the parallel-to-serial module 30.

FIG. 11 illustrates a graph that plots output frequency versus input voltage of the voltage controlled oscillator 182. In addition, the graph further illustrates the functionality of the offset module. As shown, the graph includes a nominal VCO curve 242. As such, during normal operation (i.e., without being influenced by the offset module), the voltage controlled oscillator works in accordance with the nominal curve. As illustrated, the nominal curve has an optimal linear region 241, which is the desired range of operation. When the input voltage to the voltage controlled oscillator is required to be very low with respect to the output capabilities of the charge pump, or is very high approaching $V_{DD}$, the linearity of the voltage controlled oscillator and/or phase locked loop may be effected. Therefore, it is desirable to keep the input voltage within the optimal linear region 241.

As integrated circuit processes are enabling integrated circuits to be powered by lower and lower voltages, the input voltage to achieve the desired output voltage may approach the supply voltage (e.g., $V_{DD}$) or return voltage (e.g., $V_{SS}$). To obtain optimal VCO operation, the offset module 181 offsets the output of the charge pump to VCO curve to compensate for limited supply voltage headroom. For example, if the input voltage is large (i.e., near the top of the optimal linear range 241), the offset module provides an offset (as indicated by the left pointing arrow) such that the curve is shifted as shown in curve 244. Conversely, if the desired frequency is produced at a low input voltage near the bottom of the optimal linear range 241, the offset module provides an offset (as indicated by the right pointing arrow) such that curve 246 is produced. In effect, the offset module 181 allows the VCO to operate where it needs, while allowing the charge pump to operate where it needs to.

FIG. 12 illustrates a schematic block diagram of an embodiment of offset module 181. The offset module 181 includes an amplifier 250, programmable gain network 254, logic 256, output buffer 252, comparator network 258 and divider network 260. In nominal operation, (i.e., where no offset is desired) amplifier 250 will have a gain of 1. As such, signals received at the input from the filter will be provided as is to the voltage controlled oscillator via the output buffer 252. If, however, the input is sensed to be at a level where offset would improve performance, the comparator network 258, by comparing the input voltage with the divider network 260, causes the logic 256 to change the gain of the programmable gain network 254. As such, in the illustration shown, the offset module 181 may produce an output representation of the input signal ranging from $0.8V_{IN}$ to $1.25V_{IN}$.

As one of average skill in the art will appreciate, the number of steps in changing the gain may be more or less than the number shown and the switches of the gain network may be transistors, gates, et cetera. In addition, one of average skill in the art will appreciate, other embodiments for producing the programmable gain network 254, logic 256 and corresponding inputs to the logic 256 may be readily derived based on the desired functionality of the offset module 181 and the description provided herein.

An alternate embodiment of the offset module 181 includes a DC voltage setting module and a varactor within an LC oscillator of the VCO. The varactor, which behaves as a voltage dependent capacitor, is coupled in series with AC coupling capacitors that each has a substantially greater capacitance value than the varactor. The series coupled capacitors, including the varactor, is coupled in parallel with an inductor to form an LC oscillator of the VCO. The DC voltage setting module is operably coupled to the varactor to establish the capacitance of the varactor and to establish the operating level of the input voltage to the VCO. As such, by varying the signal produced by the DC voltage setting module, the input voltage level to the VCO can be varied, thus achieving the desired offset.

Figure 13:
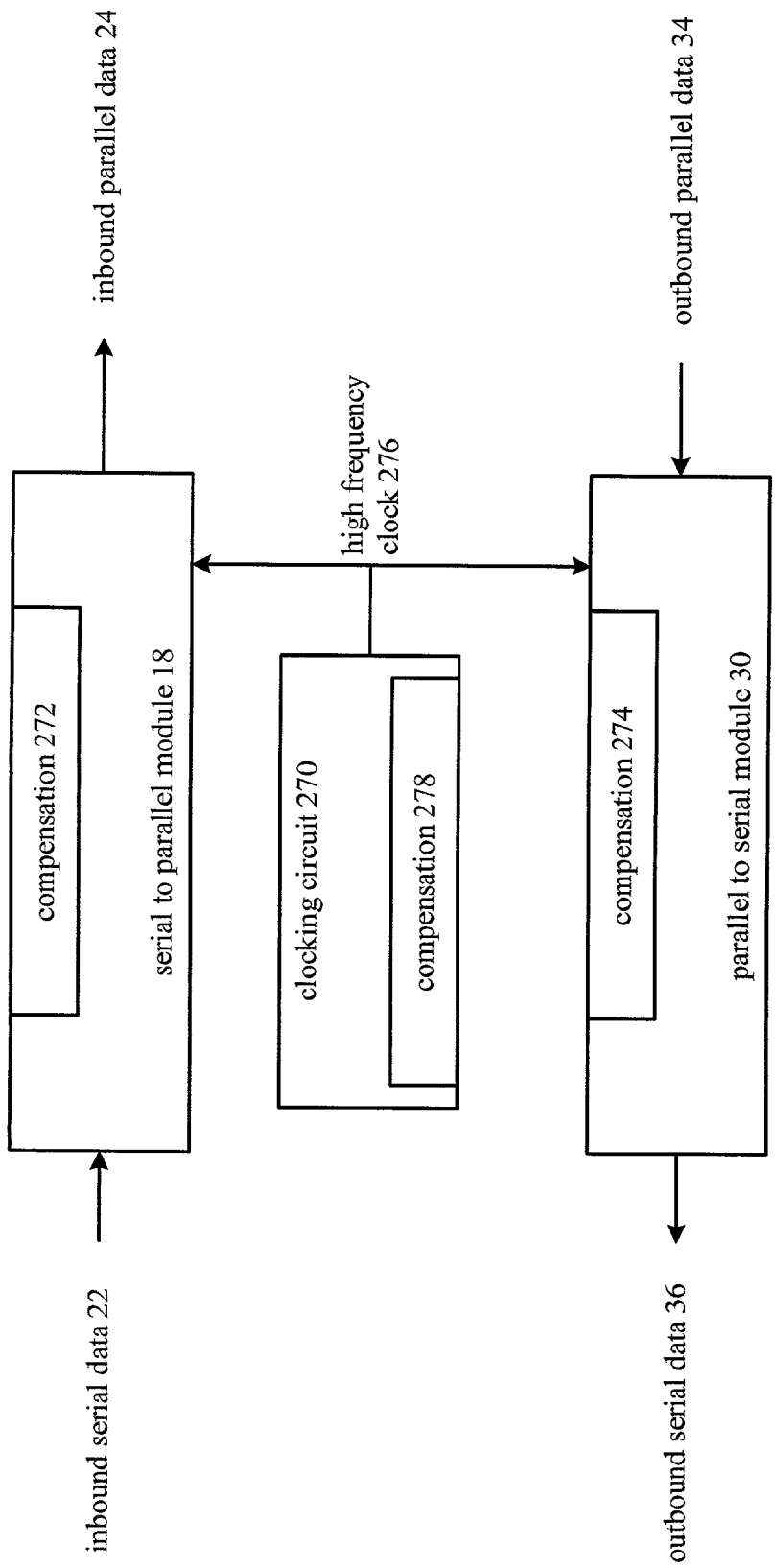
FIG. 13 illustrates a schematic block diagram of an alternate transceiver in accordance with the present invention.

FIG. 13 illustrates an alternate embodiment of a transceiver 275 that includes serial-to-parallel module 18, parallel-to-serial module 30, clocking circuit 270, and compensation 272, 274 and 278. The compensation 272, 274 and 278 compensate for integrated circuit operational limitations and/or integrated circuit fabrication limitations of the serial-to-parallel module 18, the clocking circuit 270, and/or the parallel-to-serial module 30.

In operation, the clocking circuit 270 and corresponding compensation 278 may be implemented as one of the clocking circuits illustrated in FIG. 5 or 9, a portion thereof, and/or a combination thereof to produce at least one high frequency clock 276. The at least one high frequency clock 276 is provided to both the serial-to-parallel module 18 and the parallel-to-serial module 30.

The serial-to-parallel module 18 receives inbound serial data 22 and produces inbound parallel data 24 therefrom. The implementation of the serial-to-parallel module 18 with corresponding compensation 272 may be as described with reference to FIG. 2.

The parallel-to-serial module 30 receives outbound parallel data 34 and produces outbound serial data 36 therefrom. An embodiment of the parallel-to-serial module 30 and corresponding compensation 274 may be as illustrated and described with reference to FIG. 7.

The preceding discussion has presented a high-speed transceiver that pushes the operating limits of integrated circuits. By providing IC limitation compensation, speeds previously unrealized for transceivers are obtained. As one of average skill in the art will appreciate, other embodiments may be derived from the teachings of the present invention without deviating from the scope of the claims.

What is claimed is:

1. An integrated high-speed parallel-to-serial and serial-to-parallel transceiver, wherein the transceiver comprises:
   receiver section that includes:
      receiver clocking circuit operably coupled to produce at least one high frequency receiver clock;
      serial to parallel module operably coupled to convert inbound serial data into inbound parallel data at a rate corresponding to the at least one high frequency receiver clock; and
      receiver compensation operable to at least partially compensate for at least one of integrated circuit operational limitations and integrated circuit fabrication limitations of at least one of the receiver clocking circuit and the serial to parallel module,
      wherein the receiver clocking circuit and the receiver compensation further comprise:
         fine phase detector operably coupled to produce a fine difference signal based on a phase difference between the inbound serial data and a fine feedback clock that is representative of the at least one high frequency receiver clock;
         fine charge pump operably coupled to produce a voltage representative of the fine difference signal;
         coarse phase and frequency detector operably coupled to produce a coarse difference signal based on a difference between a reference clock and a coarse feedback clock that is representative of the at least one high frequency receiver clock;
         coarse charge pump operably coupled to produce a voltage representative of the coarse difference signal;
         filter operably coupled to filter the voltage representation of the coarse difference signal and the voltage representation of the fine difference signal to produce a filtered difference representation;
         voltage controlled oscillator operably coupled to produce an oscillation based on the filtered difference representation;
         post PLL filter operably coupled to amplify and filter the oscillation to produce the at least one high frequency receiver clock; and
         coarse divider operably coupled to produce the coarse feedback clock from the at least one high frequency receiver clock;
   transmitter section that includes:
      transmitter clocking circuit operably coupled to produce at least one high frequency transmitter clock;
      parallel to serial module operably coupled to convert outbound parallel data into outbound serial data at a rate corresponding to the at least one high frequency transmitter clock; and
      transmitter compensation operable to at least partially compensate for at least one of the integrated circuit operational limitations and the integrated circuit fabrication limitations of at least one of the transmitter clocking circuit and the parallel to serial module.

2. The transceiver of claim 1, wherein the serial to parallel module and the receiver compensation further comprise:
   an analog front end operably coupled to receive and amplify the inbound serial data to produce received inbound serial data;
   even/odd splitter operably coupled to split the received inbound serial data into serial even data and serial odd data;
   even serial to parallel converter operably coupled to convert the serial even data into parallel even data;
   odd serial to parallel converter operably coupled to convert the serial odd data into parallel odd data; and
   output interface operably coupled to output the parallel even data and the parallel odd data as the inbound parallel data.

3. The transceiver of claim 2, wherein the analog front end further comprises:
   an interface;
   an inductive amplifier operably coupled to the interface; and
   a feed forward boost module operably coupled to the inductive amplifier.

4. The transceiver of claim 2, wherein each of the even and odd serial to parallel converters further comprises:

a plurality of interoperably coupled high-speed, low power, differential flip flops.

5. The transceiver of claim 1, wherein the receiver clocking circuit and the receiver compensation further comprises:
duty cycle distortion correction module operably coupled to compensate for duty cycle distortion of a differential representation of the at least one high frequency clock.

6. The transceiver of claim 1, wherein the at least one high frequency receiver clock further comprises:
critical analog high frequency receiver clock;
analog high frequency receiver clock; and
digital high frequency receiver clock.

7. The transceiver of claim 1, wherein the parallel to serial module and the transmitter compensation further comprise:
interface operably coupled to receive the outbound parallel data;
even parallel to serial converter operably coupled to convert an even portion of the outbound parallel data into even serial outbound data;
odd parallel to serial converter operably coupled to convert an odd portion of the outbound parallel data into odd serial outbound data;
combiner operably coupled to combine the even serial outbound data and the odd serial outbound data into combined serial data; and
driver operably coupled to produce the outbound serial data from the combined serial data.

8. The transceiver of claim 7, wherein the interface further comprises:
differential input interface having a calibrated input impedance; and
buffer operably coupled to temporarily store the outbound parallel data received via the differential input interface.

9. The transceiver of claim 7, wherein each of the even and odd parallel to serial converters further comprises:
a plurality of interoperably coupled high-speed, low power, differential flip flops.

10. The transceiver of claim 1, wherein the transmitter clocking circuit and the transmitter compensation further comprise:
phase and frequency detector operably coupled to produce a difference signal based on a difference between a reference clock and a feedback clock that is representative of the at least one high frequency transmitter clock;
charge pump operably coupled to produce a voltage representative of the difference signal;
filter operably coupled to filter the voltage representation of the difference signal to produce a filtered difference representation;
voltage controlled oscillator operably coupled to produce an oscillation based on the filtered difference representation;
post PLL filter operably coupled to amplify and filter the oscillation to produce the at least one high frequency transmitter clock; and
divider operably coupled to produce the feedback clock from the at least one high frequency transmitter clock.

11. The transceiver of claim 10, wherein the transmitter clocking circuit and the transmitter compensation further comprises:
offset module operably coupled to provide DC offset compensation by modifying the filtered difference representation.

12. The transceiver of claim 10, wherein the transmitter clocking circuit and the transmitter compensation further comprise:
duty cycle correction module operably coupled to correct duty cycle of the at least one high frequency transmitter clock.

13. The transceiver of claim 12, wherein the transmitter clocking circuit and the transmitter compensation further comprise:
phase error correction circuit operably coupled to correct phase error of the at least one high frequency transmitter clock.

14. A high-speed parallel-to-serial and serial-to-parallel, wherein the transceiver comprises:
clocking circuit operably coupled to produce at least one high frequency clock;
serial to parallel module operably coupled to convert inbound serial data into inbound parallel data at a rate corresponding to the at least one high frequency clock;
parallel to serial module operably coupled to convert outbound parallel data into outbound serial data at a rate corresponding to the at least one high frequency clock; and
compensation operable to at least partially compensate for at least one of integrated circuit operational limitations and integrated circuit fabrication limitations of at least one of the clocking circuit, the parallel to serial module, and the serial to parallel module, wherein the clocking circuit and the compensation further comprise:
fine phase detector operably coupled to produce a fine difference signal based on a phase difference between the inbound serial data and a fine feedback clock that is representative of the at least one high frequency receiver clock;
fine charge pump operably coupled to produce a voltage representative of the fine difference signal;
coarse phase and frequency detector operably coupled to produce a coarse difference signal based on a difference between a reference clock and a coarse feedback clock that is representative of the at least one high frequency receiver clock;
coarse charge pump operably coupled to produce a voltage representative of the coarse difference signal;
filter operably coupled to filter the voltage representation of the coarse difference signal and the voltage representation of the fine difference signal to produce a filtered difference representation;
voltage controlled oscillator operably coupled to produce an oscillation based on the filtered difference representation;
post PLL filter operably coupled to amplify and filter the oscillation to produce the at least one high frequency receiver clock;
coarse divider operably coupled to produce the coarse feedback clock from the at least one high frequency receiver clock.

15. The transceiver of claim 14, wherein the clocking circuit and the compensation further comprises:
duty cycle distortion correction module operably coupled to compensate for duty cycle distortion of a differential representation of the at least one high frequency clock.

16. The transceiver of claim 14, wherein the parallel to serial module and the compensation further comprise:
interface operably coupled to receive the outbound parallel data;

even parallel to serial converter operably coupled to convert an even portion of the outbound parallel data into even serial outbound data;

odd parallel to serial converter operably coupled to convert an odd portion of the outbound parallel data into odd serial outbound data;

combiner operably coupled to combine the even serial outbound data and the odd serial outbound data into combined serial data; and driver operably coupled to produce the outbound serial data from the combined serial data.

17. The transceiver of claim 16, wherein the interface further comprises:

differential input interface having a calibrated input impedance; and buffer operably coupled to temporarily store the outbound parallel data received via the differential input interface.

18. The transceiver of claim 17, wherein each of the even and odd parallel to serial converters further comprises:

a plurality of interoperably coupled high-speed, low power, differential flip flops.

19. An integrated high-speed serial-to-parallel receiver, wherein the receiver comprises:

clocking circuit operably coupled to produce at least one high frequency clock;

serial to parallel module operably coupled to convert inbound serial data into inbound parallel data at a rate corresponding to the at least one high frequency clock; and compensation operable to at least partially compensate for at least one of integrated circuit operational limitations and integrated circuit fabrication limitations of at least one of the clocking circuit and the serial to parallel module, wherein the serial to parallel module and the compensation further comprise:

an analog front end operably coupled to receive and amplify the inbound serial data to produce received inbound serial data;

even/odd splitter operably coupled to split the received inbound serial data into serial even data and serial odd data;

even serial to parallel converter operably coupled to convert the serial even data into parallel even data;

odd serial to parallel converter operably coupled to convert the serial odd data into parallel odd data; and output interface operably coupled to output the parallel even data and the parallel odd data as the inbound parallel data wherein the clocking circuit and the compensation further comprise:

fine phase detector operably coupled to produce a fine difference signal based on a phase difference between the inbound serial data and a fine feedback clock that is representative of the at least one high frequency receiver clock;

fine charge pump operably coupled to produce a voltage representative of the fine difference signal;

coarse phase and frequency detector operably coupled to produce a coarse difference signal based on a difference between a reference clock and a coarse feedback clock that is representative of the at least one high frequency receiver clock;

coarse charge pump operably coupled to produce a voltage representative of the coarse difference signal;

filter operably coupled to filter the voltage representation of the coarse difference signal and the voltage representation of the fine difference signal to produce a filtered difference representation;

voltage controlled oscillator operably coupled to produce an oscillation based on the filtered difference representation;

post PLL filter operably coupled to amplify and filter the oscillation to produce the at least one high frequency receiver clock; and coarse divider operably coupled to produce the coarse feedback clock from the at least one high frequency receiver clock.

20. The receiver of claim 19, wherein the analog front end further comprises:

an interface;

an inductive amplifier operably coupled to the interface; and a feed forward boost module operably coupled to the inductive amplifier.

21. The receiver of claim 19, wherein each of the even and odd serial to parallel converters further comprises:

a plurality of interoperably coupled high-speed, low power, differential flip flops.

22. The receiver of claim 19, wherein the clocking circuit and the compensation further comprises:

duty cycle distortion correction module operably coupled to compensate for duty cycle distortion of a differential representation of the at least one high frequency clock.

* * * * *